Figure 1:
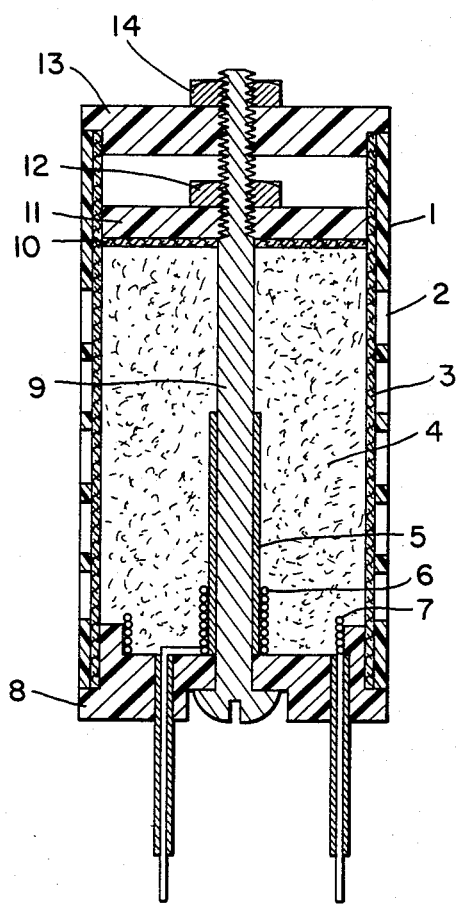

United States Patent [19]

Larson

[11] Patent Number: 4,531,087
[45] Date of Patent: Jul. 23, 1985

[54] ELECTRICAL SENSOR FOR MEASURING MOISTURE IN LANDSCAPE AND AGRICULTURAL SOILS

[76] Inventor: Glenn F. Larson, 1042 Arbolado Rd., Santa Barbara, Calif. 93103

[21] Appl. No.: 386,693

[22] Filed: Jun. 9, 1982

[51] Int. Cl.³ .................. A01G 25/00; G01R 27/02
[52] U.S. Cl. ........................ 324/65 P; 73/73
[58] Field of Search .............. 137/78.2, 78.3; 73/73, 73/74; 324/65 P, 61 P

[56] References Cited

U.S. PATENT DOCUMENTS

| | | | |
|---|---|---|---|
| 2,768,028 | 10/1956 | Robinson | 137/78.3 |
| 3,376,501 | 4/1968 | Peranio | 324/65 P |
| 3,412,325 | 11/1968 | Soderling | 324/65 P |
| 4,137,931 | 2/1979 | Hasenbeck | 137/78.3 |

FOREIGN PATENT DOCUMENTS

| | | | |
|---|---|---|---|
| 922225 | 3/1963 | United Kingdom | 324/65 P |
| 1387201 | 3/1972 | United Kingdom | 324/65 P |
| 1419235 | 12/1975 | United Kingdom | 324/65 P |

*Primary Examiner*—Stanley T. Krawczewicz
*Assistant Examiner*—Jose M. Solis

[57] ABSTRACT

An improved electrical conductance soil moisture sensor for landscape and agriculture comprising electrodes imbedded in a granular medium that is separated from the soil to be measured by a layer of filter cloth supported by a plastic or metal screen.

1 Claim, 1 Drawing Figure

ELECTRICAL SENSOR FOR MEASURING MOISTURE IN LANDSCAPE AND AGRICULTURAL SOILS

FIELD OF THE INVENTION

This invention relates to the field of soil moisture measurement in landscape and agriculture soils either by manual reading in the field or as a sensing element for automatic irrigation control.

DISCUSSION OF PRIOR ART

Electrical conductance soil moisture sensors consisting of electrodes imbedded in a fixed particle size fill material or aggregate of particle sizes and contained in a porous ceramic housing have been manufactured by us for years and have been covered by U.S. Pat. Nos. 2,941,174, 3,181,089, and 4,137,931. In operation the electrical resistance between the electrodes changes with the amount of moisture contained within the internal particle fill. When buried in the soil the sensor releases or takes up moisture from the soil following the laws of unsaturated flow in a porous medium. The forces involved are basically capillary in nature and water movement is a function of the pore size of the ceramic shell and the particle fill. These forces are known by various terms such as matric potential, soil tension or soil suction. The force is measured in centibars by means of a tensiometer and duplicated with the use of pressure plate apparatus.

There are excellent advantages to the use of a separate particle fill to imbed the electrodes in rather than a solid porous material such as gypsum plaster. By varying the particle size or combination of particle sizes of the fill material, the sensor electrical characteristics can be tailored to fit any type of soil to be measured as well as to shorten or lengthen the range of moisture measured and/or the response time in wetter soils. The separate particle fill also gives a stable pore size and maintans a consistent electrode contact over the years.

In the present state of the art the sensor utilizes a porous ceramic shell or cup to contain the particle fill that surrounds the electrodes. This means that the ceramic pore size, because the ceramic has its own moisture release characteristices, has to be on average smaller than the pore size of the particle mix or there is little or no water movement from the particle mix to the ceramic once the ceramic pores have been drained of their water by the surrounding soil that is to be measured. Any fixed pore material, ceramic, metal or plastic that is used as a container for the particle mix must hold water longer or at greater tension than the particle mix it contains. This then has always been the primary problem with this type of sensor. To measure soil moisture in the 100 centibar range the average pore size of the ceramic has to be in the order of one to two microns or smaller. Also, this pore size as well as the pore distribution must be consistent between sensors or they will have a major difference in response time to both the release and the up take of soil moisture. Porous ceramics of this order of pore size are difficult to manufacture. At present the only way is by slip casting which is a very slow and expensive process and is difficult to hold manufacturing tolerances so final machining is usually required. It is possible to use isostatic or pressure forming but here again the pore size and distribution varies from lot to lot. Firing temperatures are very critical with both methods. Sintered metals are subject to corrosion in the soil with the resulting change of pore size and clogging. Porous plastics are not available in castings with this small a pore size and are generally hydrophobic without special treatment. Another problem of using a fixed pore container is that in fine soils and in some saline soils these extremely small pores tend to clog up over the years thereby changing the sensors rate of response and the consistency of readings between sensors.

OBJECT OF THE INVENTION

It is the object of my invention to provide a soil moisture sensor utilizing the advantages of an internal particle fill material without the expense and clogging problems of a ceramic container. The sensor consists of electrodes imbedded in a preselected fill which is held in place by a layer of filter cloth wich is in turn supported by an open mesh screen or perforated tube of metal or plastic. The porosity of the filter cloth only has to be smaller than the smallest particle size in the fill material and doesn't have to be smaller than the smallest pore size in the fill. This invention means that each sensor will be consistent with all other sensors with the same particle fill material, will be inexpensive to manufacture and will eliminate the clogging problem. I found that when a sensor using the filter cloth was buried in soil by grouting in with a slurry of the soil to be measured that the necessary contact between the particle mix and the soil to be measured was easily established through the filter cloth and with the filter cloth having no measureable effect on the movement of moisture from the soil to the fill or from the fill to the soil. This has been proven with various combinations of soils, fills and filter cloths.

DESCRIPTION OF THE INVENTION

FIG. 1 shows in cross section a cylindrical sensor ⅞ inch in diameter and 1¾ inches long. The support tube (1) is a plastic or metal tube or screen with openings (2) sufficient to enable the soil to be measured to make substantial contact with the filter cloth (3). The support tube (1) shown is a plastic tube 0.035 wall thickness with 7/32 inch round wal openings. An 8×8 stainless steel screen tube can be substituted. The filter cloth (3) is of any non-deteriorating material with openings smaller than the smallest particle of the fill (4). For soil moisture measurements up to 100 centibars with the smallest fill particle of a 325 mesh ground quartz, a filter cloth (3) equivilent to Dupont Companys "Reemay" filter cloth #2024 which has a 15 to 25 micron opening, a thickness of 11-13 mils has proven satisfactory. Inner (6) and outer (7) electrodes shown are wound coils of 321 stainless wire 0.030 in diameter. The inner (6) electrode is insulated (5) from the clamping screw (9) to eliminate any electrical conduction from the clamping screw (9) to the outer (7) electrode through the soil to be measured rather than the particle fill (4). The bottom cap (8), clamping screw (9), clamping seal (10), claimping washer (11) and clamping nut (12) all serve to compress the fill material (4) to insure a stable pore size. Top hold down cap (13) and nut (14) clamps the sensor together. The above is one embodiment of the invention and various other configurations such as using an outer metal screen and the clamping screw as the electrodes or making the sensor wafer shaped rather than cylindrical are within the scope of this patent.

I claim:

1. An electrical conductivity sensor for the measurement of moisture in a soil medium comprising:
a granulous porous medium;
at least two electrodes imbedded in said granulous medium;
a layer of filter cloth surrounding said porous medium for separating it from said soil medium;
a rigid support structure holding said filter cloth in place around said granulous porous medium and allowing a free exchange of moisture between said soil medium and said granulous porous medium.

* * * * *